(12) United States Patent
Jeong et al.

(10) Patent No.: US 9,391,297 B2
(45) Date of Patent: *Jul. 12, 2016

(54) ORGANIC LIGHT EMITTING DISPLAY APPARATUS

(71) Applicant: Samsung Display Co., Ltd., Yongin, Gyeonggi-Do (KR)

(72) Inventors: Chang-Yong Jeong, Yongin (KR); Mu-Gyeom Kim, Yongin (KR)

(73) Assignee: Samsung Display Co., Ltd., Giheung-Gu, Yongin-si, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/708,580

(22) Filed: May 11, 2015

(65) Prior Publication Data

US 2015/0243929 A1    Aug. 27, 2015

Related U.S. Application Data

(63) Continuation of application No. 14/012,285, filed on Aug. 28, 2013, now Pat. No. 9,029,858.

(30) Foreign Application Priority Data

Jan. 3, 2013    (KR) .................. 10-2013-0000638

(51) Int. Cl.

| H01L 29/04 | (2006.01) |
| H01L 31/036 | (2006.01) |
| H01L 31/0376 | (2006.01) |
| H01L 31/20 | (2006.01) |
| H01L 51/52 | (2006.01) |
| H01L 27/32 | (2006.01) |
| H01L 51/00 | (2006.01) |

(52) U.S. Cl.
CPC ........ *H01L 51/5253* (2013.01); *H01L 27/3244* (2013.01); *H01L 51/0096* (2013.01); *H01L 51/5237* (2013.01)

(58) Field of Classification Search
CPC . H01L 27/32; H01L 27/3202; H01L 27/3204; H01L 27/3209; H01L 27/3225; H01L 27/3251; H01L 27/3258; H01L 2227/32; H01L 2924/12044
USPC .......................................... 257/59, 72, 79, 81
See application file for complete search history.

(56) References Cited

U.S. PATENT DOCUMENTS

| 9,029,858 B2 * | 5/2015 | Jeong .................. H01L 51/5237 257/59 |
| 2011/0297942 A1 | 12/2011 | Kim et al. |
| 2012/0098426 A1 | 4/2012 | Lee et al. |
| 2012/0107978 A1 | 5/2012 | Shin et al. |
| 2012/0170223 A1 | 7/2012 | Yoon |

FOREIGN PATENT DOCUMENTS

| KR | 10-2012-0042146 | 5/2012 |
| KR | 10-2012-0045682 | 5/2012 |
| KR | 10-2012-0076070 | 7/2012 |

* cited by examiner

*Primary Examiner* — Hoai V Pham
(74) *Attorney, Agent, or Firm* — Robert E. Bushnell, Esq.

(57) ABSTRACT

Provided is an organic light emitting display apparatus. The organic light emitting display apparatus includes: a substrate; a display unit disposed on the substrate; an encapsulation layer covering the display unit; an integrated circuit device disposed on an outer portion of the display unit on the substrate; and a transparent protection unit (window) disposed on the encapsulation layer and separated from the integrated circuit device.

18 Claims, 2 Drawing Sheets

ORGANIC LIGHT EMITTING DISPLAY APPARATUS

CROSS-REFERENCE TO RELATED APPLICATIONS AND CLAIM OF PRIORITY

This application is a continuation application of the prior application Ser. No. 14/012,285 filed in the U.S. Patent & Trademark Office on 28 Aug. 2013 and assigned to the assignee of the present invention. Furthermore, this application makes reference to, incorporates the same herein, and claims all benefits accruing under 35 U.S.C. §119 from an application earlier filed in the Korean Intellectual Property Office on 3 Jan. 2013 and there duly assigned Serial No. 10-2013-0000638.

BACKGROUND OF THE INVENTION

1. Field of the Invention

An embodiment of the present invention relates to an organic light emitting display apparatus, and more particularly, to a slimmer organic light emitting display apparatus.

2. Description of the Related Art

In general, an organic light emitting display apparatus includes an organic light emitting device disposed on a display unit, and the organic light emitting device includes a pixel electrode that faces an opposite electrode and an emission layer disposed between the pixel electrode and the opposite electrode. Such an organic light emitting device is vulnerable to external moisture or oxygen, and thus, the organic light emitting device is encapsulated so that external impurities may not infiltrate therein.

To encapsulate an organic light emitting device, an encapsulation substrate having a predetermined thickness or greater has been contemporarily used. Because the encapsulation substrate is thick, however, a total thickness of the organic light emitting display apparatus disadvantageously increases.

Accordingly, to make a slimmer organic light emitting display apparatus, a method of encapsulating the organic light emitting device by using a film instead of using an encapsulation substrate, has been suggested. When the organic light emitting device is encapsulated by a film, the organic light emitting device and the organic light emitting display apparatus become thinner.

An integrated circuit device may be disposed on a substrate of an organic light emitting display apparatus as a chip-on-class type. Therefore, if a thickness of the integrated circuit device is greater than a thickness of the organic light emitting device and the film, the integrated circuit device may contact a structure disposed on the film. Since the integrated circuit device is weak against external shock, the integrated circuit device may break when contacting the structure disposed on the film.

The above information disclosed in this Background section is only for enhancement of understanding of the background of the described technology and therefore it may contain information that does not form the prior art that is already known in this country to a person of ordinary skill in the art.

SUMMARY OF THE INVENTION

An embodiment of the present invention provides a slim organic light emitting display apparatus that is highly applicable.

According to an aspect of the present invention, there is provided an organic light emitting display apparatus including: a substrate; a display unit disposed on the substrate; an encapsulation layer covering the display unit; an integrated circuit device disposed on an outer portion of the display unit on the substrate; and a transparent protection unit (window) disposed on the encapsulation layer and separated from the integrated circuit device.

The transparent protection unit may extend longer than the substrate, and the integrated circuit device may be disposed under the transparent protection unit.

The substrate may extend longer than the encapsulation layer, and the integrated circuit device may be disposed on an extended region of the substrate.

The integrated circuit device may be disposed on an edge portion of the substrate.

The encapsulation layer may be formed by alternately stacking one or more organic layers and one or more inorganic layers.

A first recess may be formed in the substrate on an outer portion of the encapsulation layer, and the integrated circuit device may be disposed in the first recess.

The first recess may have a depth that is less than a thickness of the integrated circuit device.

The thickness of the integrated circuit device may be greater than a sum of a thickness of the display unit and a thickness of the encapsulation layer.

The depth of the first recess may be greater than a value that is obtained by subtracting the sum of the thickness of the display unit and the thickness of the encapsulation layer from the thickness of the integrated circuit device.

The thickness of the integrated circuit device may be less than a height from the first recess to the transparent protection unit.

According to another aspect of the present invention, there is provided an organic light emitting display apparatus including: a substrate; a display unit disposed on the substrate; an encapsulation layer covering the display unit; an integrated circuit device disposed on an outer portion of the display unit on the substrate; and a transparent protection unit disposed on the encapsulation layer and separated from the integrated circuit device. The transparent protection unit has a second recess in a portion geometrically corresponding to the integrated circuit device, and a part of the integrated circuit device is in the second recess.

The transparent protection unit may extend longer than the substrate, and the integrated circuit device may be disposed under the transparent protection unit.

The substrate may extend longer than the encapsulation layer, and the integrated circuit device may be disposed on an extended region of the substrate.

The integrated circuit device may be disposed on an edge portion of the substrate.

The encapsulation layer may be formed by alternately stacking one or more organic layers and one or more inorganic layers.

The second recess may have a depth that is less than a thickness of the integrated circuit device.

The thickness of the integrated circuit device may be greater than a sum of a thickness of the display unit and a thickness of the encapsulation layer.

The depth of the second recess may be greater than a value that is obtained by subtracting the sum of the thickness of the display unit and the thickness of the encapsulation layer from the thickness of the integrated circuit device.

The thickness of the integrated circuit device may be less than a height from the substrate to the second recess.

A buffer unit may be formed in the second recess.

The transparent protection unit may include a protrusion on an opposite surface to the region where the second recess is formed.

According to still another aspect of the present invention, there is provided an organic light emitting display apparatus including: a substrate; a display unit disposed on the substrate; an encapsulation layer covering the display unit; an integrated circuit device disposed on an outer portion of the display unit on the substrate; and a transparent protection unit disposed on the encapsulation layer and separated from the integrated circuit device. A first recess is formed in the substrate on an outer portion of the encapsulation layer, and a second recess is formed in the transparent protection unit on a portion geometrically corresponding to the integrated circuit device. The integrated circuit device is disposed in the first recess and a part of the integrated circuit device is disposed in the second recess.

A thickness of the integrated circuit device may be greater than a sum of a thickness of the display unit and a thickness of the encapsulation layer.

A sum of a depth of the first recess and a depth of the second recess may be greater than a value that is obtained by subtracting the sum of the thickness of the display unit and the thickness of the encapsulation layer from the thickness of the integrated circuit device.

The thickness of the integrated circuit device may be less than a height from the first recess to the second recess.

A buffer unit may be formed in the second recess.

The transparent protection unit may include a protrusion on an opposite surface to the region where the second recess is formed.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Although a few embodiments of the present invention have been shown and described, it would be appreciated by those skilled in the art that changes may be made in these exemplary embodiments without departing from the principles and spirit of the invention, the scope of which is defined in the claims and their equivalents.

It will be understood that although the terms 'first' and 'second' are used herein to describe various elements, these elements should not be limited by these terms. These terms are only used to distinguish one element from another element. Thus, a first element discussed below could be termed a second element, and similarly, a second element may be termed a first element without departing from the teachings of this disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of the present invention will be described in detail with reference to accompanying drawings.

Figure 1:
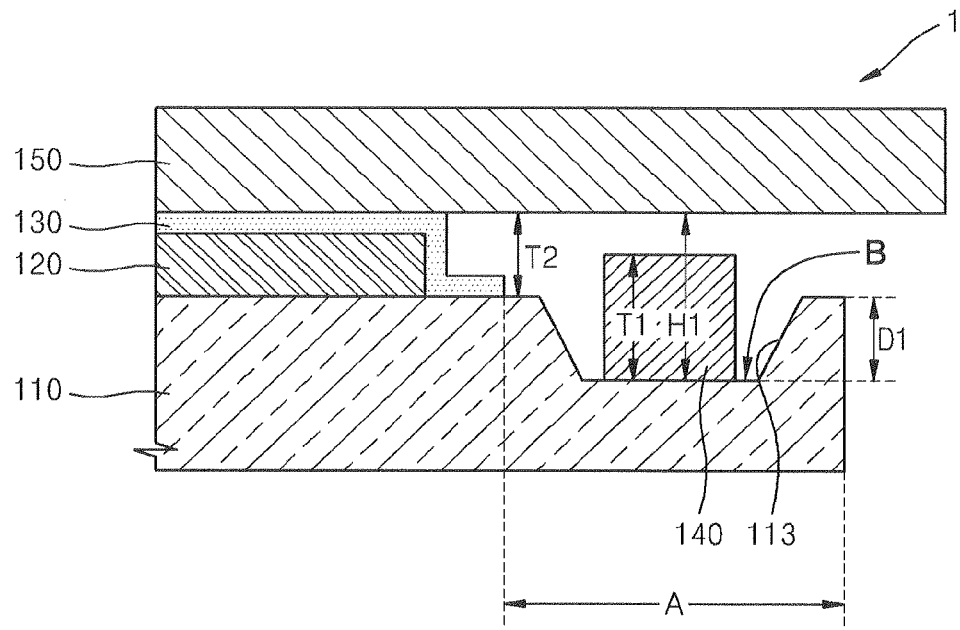
FIG. 1 is a cross-sectional view schematically showing a part of an organic light emitting display apparatus according to an embodiment of the present invention.

FIG. 1 is a cross-sectional view schematically showing a part of an organic light emitting display apparatus 1 according to an embodiment of the present invention.

In reference to FIG. 1, the organic light emitting display apparatus 1 may include a substrate 110, a display unit 120, an encapsulation layer 130, an integrated circuit device 140, and a transparent protection unit (window) 150.

The display unit 120 may be disposed on the substrate 110, and the encapsulation layer 130 may cover the display unit 120. In one embodiment, the encapsulation layer 130 may completely cover the display unit 120. Also, the integrated circuit device 140 may be disposed on the substrate 110 at an outer side of the display unit 120. Also, the transparent protection unit 150 may be disposed on the encapsulation layer 130. In addition, the transparent protection unit 150 and the integrated circuit device 140 are separated from and spaced apart from each other.

The substrate 110 may be formed of various materials, for example, glass, metal, or plastic.

The substrate 110 may extend so as to have a length that is longer than that of the encapsulation layer 130, and the integrated circuit device 140 may be disposed on an extended region A of the substrate 110.

A first recess 113 may be formed in the substrate 110 at an outer side of the encapsulation layer 130. The first recess 113 may be formed simultaneously with the formation of the substrate 110, or may be formed by removing a part of the substrate 110 by using an etchant or a laser ablation method after the formation of the substrate 110 having flat surfaces. In addition, the integrated circuit device 140 may be disposed in the first recess 113. Also, a depth D1 of the first recess 113 may be less than a thickness T1 of the integrated circuit device 140.

The display unit 120 is disposed on the substrate 110. The display unit 120 may include a plurality of organic light emitting devices.

The encapsulation layer 130 may be formed of an organic material or an inorganic material. In particular, if the encapsulation layer 130 is formed only by using an organic layer or an inorganic layer, external oxygen or moisture may infiltrate through fine passages formed in a film, and thus, the encapsulation layer 130 having a multi-layered structure may be formed by stacking organic layers and inorganic layers alternately. When such a composite layer of organic/inorganic layers is used, an organic layer may be formed of, for example, an acryl-based material, and an inorganic layer may be formed of, for example, aluminium oxide. The display unit 120 and the encapsulation layer 130 will be described in more detail with reference to FIG. 4 below.

The integrated circuit device 140 may be disposed on the substrate 110 at the outer side of the display unit 120 to control light emission from the display unit 120. That is, the integrated circuit device 140 may be disposed on the substrate 110 as a chip on glass (COG) type. Also, in this case, the integrated circuit device 140 may be disposed under the transparent protection unit 150 disposed on the display unit 120. In addition, the integrated circuit device 140 may be disposed on an edge portion of the substrate 110. The integrated circuit device 140 includes a main body (not shown) and a bump (not shown), and is electrically connected to a pad (not shown) extending from the display unit 120 to apply electric signals to the display unit 120.

The transparent protection unit 150 may be disposed on the encapsulation layer 130. Also, the transparent protection unit 150 may be separated from and spaced apart from the integrated circuit unit 140. The transparent protection unit 150 may be attached to a housing (not shown) by an adhesive member (not shown). Also, the transparent protection unit 150 may extend so as to have a length that is longer than that of the substrate 110. In addition, the integrated circuit device 140 may be disposed under the transparent protection unit 150.

The thickness T1 of the integrated circuit device 140 may be greater than or less than the sum T2 of the thickness of the display unit 120 and the thickness of the encapsulation layer 130.

If the thickness T1 of the integrated circuit device 140 is less than the sum T2 of the thickness of the display unit 120 and the thickness of the encapsulation layer 130, the integrated circuit device 140 is disposed on the outer side of the display unit 120 and below the transparent protection unit 150 on the substrate 110, and at the same time, the integrated circuit device 140 may be separated from the transparent protection unit 150.

However, the thickness T1 of the integrated circuit device 140 is generally greater than the sum T2 of the thickness of the display unit 120 and the thickness of the encapsulation layer 130. In this case, when the integrated circuit device 140 is disposed on the substrate 110, the integrated circuit device 140 contacts the transparent protection unit 150 disposed on the encapsulation layer 130. Since the integrated circuit device 140 has a low breaking strength, when the integrated circuit device 140 contacts the transparent protection unit 150, the integrated circuit unit 140 is vulnerable to external shock.

Therefore, if the thickness T1 of the integrated circuit device 140 is greater than the sum T2 of the thickness of the display unit 120 and the thickness of the encapsulation layer 130, the first recess 113 may be formed in the substrate 110 on the outer side of the encapsulation layer 130. Here, a depth D1 of the first recess 113 may be greater than a value obtained by subtracting the sum T2 from the thickness T1 of the integrated circuit device 140. When the integrated circuit device 140 is disposed in the first recess 113 formed as described above, the thickness T1 of the integrated circuit device 140 may be less than a height H1 measured from the bottom surface B of the first recess 113 to the lower surface of the transparent protection unit 150. That is, when the integrated circuit device 140 is disposed in the first recess 113 of the substrate 110, the integrated circuit device 140 may be separated from the transparent protection unit 150. That is, since the integrated circuit device 140 is separated from the transparent protection unit 150, a direct transfer of an external shock to the integrated circuit device 140 may be prevented. As such, the organic light emitting display apparatus 1 may be manufactured slimmer, and at the same time, damage to the integrated circuit device 140 may be prevented, thereby improving the reliability of the organic light-emitting display apparatus 1.

Figure 4:
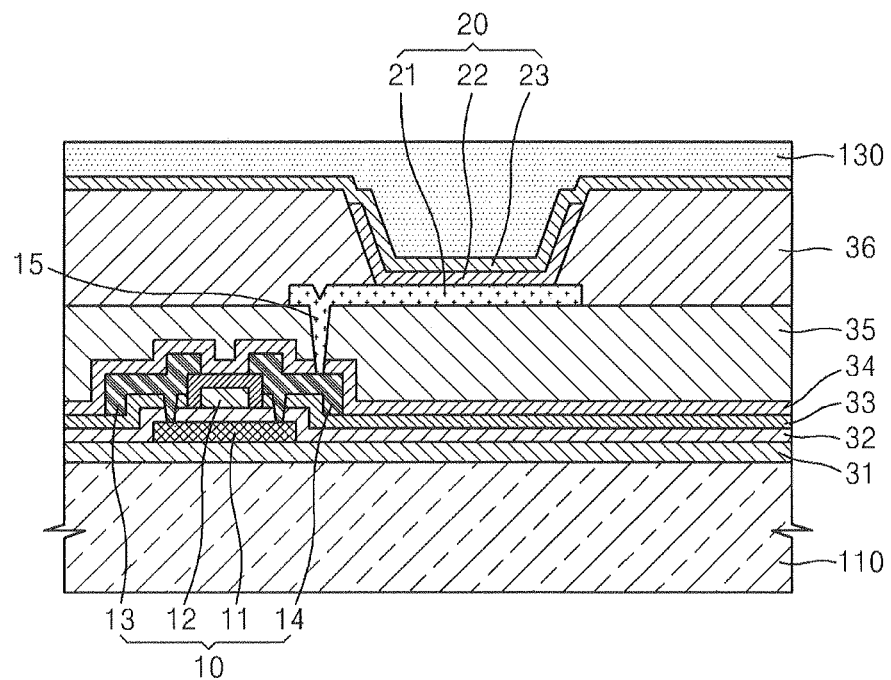
FIG. 4 is a cross-sectional view schematically showing a part of an organic light emitting display apparatus according to another embodiment of the present invention.

FIG. 4 is a cross-sectional view schematically showing a part of an organic light emitting display apparatus according to another embodiment of the present invention. The display unit 120 and the encapsulation layer 130 will be described in detail with reference to FIG. 4.

In reference to FIG. 4, the organic light emitting display apparatus includes the substrate 110, the display unit 120 including an organic light emitting device 20, and the encapsulation layer 130.

The organic light emitting device 20 and a thin film transistor (TFT) 10 connected to the organic light emitting device 20 are disposed on the substrate 110. Although FIG. 4 shows one organic light emitting device 20 and one TFT 10 for convenience of description, the organic light emitting display apparatus according to the present embodiment may include a plurality of organic light emitting devices 20 and a plurality of TFTs 10.

The organic light emitting display apparatus may be classified as a passive matrix (PM) type and an active matrix (AM) type according to whether the organic light emitting device 20 is driven by a TFT. The organic light emitting display apparatus of the present embodiment may be applied to any of the PM type and the AM type display apparatuses. Hereinafter, an AM type organic light emitting display apparatus will be described as an example.

A buffer layer 31 formed of $SiO_2$ and/or $SiN_x$ may be further formed on the substrate 110 for planarizing the substrate 110 and preventing impurity ions from infiltrating into the substrate 110.

An active layer 11 of the TFT 10 is formed of a semiconductor material on the buffer layer 31. The active layer 11 may be formed of polycrystalline silicon; however, the present invention is not limited thereto, and the active layer 11 may be formed of oxide semiconductor. For example, the oxide semiconductor may include an oxide of a material selected from Group 12, Group 13, and Group 14 metal elements such as zinc (Zn), indium (In), gallium (Ga), tin (Sn), cadmium (Cd), germanium (Ge), and hafnium (Hf), and combinations thereof. For example, the active layer 11 may include G-I—Z—O[$(In_2O_3)a(Ga_2O_3)b(ZnO)c$] (a, b, and c are real numbers respectively satisfying conditions a≥0, b≥0, and c>0).

A gate insulating layer 32 is formed to cover the active layer 11. A gate electrode 12 is formed on the gate insulating layer 32, and an interlayer dielectric 33 is formed to cover the gate electrode 12. A source electrode 13 and a drain electrode 14 are formed on the interlayer dielectric 33, and a passivation layer 34 and a planarization layer 35 are sequentially formed in this order to cover the source and drain electrodes 13 and 14.

The gate insulating layer 32, the interlayer dielectric 33, the passivation layer 34, and the planarization layer 35 may be formed of an insulating material to have single-layered or multi-layered structures including an inorganic material, an organic material, or an organic/inorganic compound material. The above stacked structure of the TFT 10 is an example, and TFTs with various structures may be used.

A first electrode 21 that is an anode electrode of the organic light emitting device 20 is formed on the planarization layer 35, and a pixel define layer 36 is formed of an insulating material to cover the first electrode 21. A predetermined opening is formed in the pixel define layer 36, and an organic emission layer 22 of the organic light emitting device 20 is formed in a region defined by the opening. In addition, a second electrode 23 that is a cathode electrode of the organic light emitting device 20 is formed to cover all pixels. Polarities of the first electrode 21 and the second electrode 23 may be exchanged.

The first electrode 21 may be formed as a transparent electrode or a reflective electrode. If the first electrode 21 is formed as a transparent electrode, the first electrode 21 may be formed of indium tin oxide (ITO), indium zinc oxide (IZO), ZnO, or $In_2O_3$. If the first electrode 21 is formed as a reflective electrode, the first electrode 21 may include a reflective layer formed of Ag, Mg, Al, Pt, Pd, Au, Ni, Nd, Ir, Cr, or a compound thereof, and a film formed of ITO, IZO, ZnO, or $In_2O_3$ on the reflective layer. The second electrode 23 may be formed as a transparent electrode or a reflective electrode. If the second electrode 23 is formed as a transparent electrode, the second electrode 23 may include a film formed by depositing Li, Ca, LiF/Ca, LiF/Al, Al, Mg, or compound thereof to face the organic emission layer 22, and an auxiliary electrode or a bus electrode line formed of a transparent electrode forming material such as ITO, IZO, ZnO, or $In_2O_3$ on the film. In addition, if the second electrode 23 is formed as a reflective electrode, the second electrode 23 may be formed by depositing Li, Ca, LiF/Ca, LiF/Al, Al, Mg, or a compound thereof.

The organic emission layer 22 formed between the first and second electrodes 21 and 23 may be formed of a low molecular weight or a high molecular weight organic material. If a low-molecular weight organic material is used, then the organic emission layer 22 may have a single or multi-layer structure including at least one selected from the group consisting of a hole injection layer (HIL), a hole transport layer (HTL), an emission layer (EML), an electron transport layer (ETL), and an electron injection layer (EIL). Examples of available organic materials may include copper phthalocyanine (CuPc), N,N'-di(naphthalene-1-yl)-N,N'-diphenyl-benzidine (NPB), tris-8-hydroxyquinoline aluminum ($Alq_3$), and the like. The low molecular weight organic material may be vacuum deposited by using masks.

If a high-molecular weight organic material is used, the organic emission layer 22 may have a structure further including an HTL (not shown) toward the anode electrode. Here, the HTL may be formed of poly(3,4-ethylenedioxythiophene) (PEDOT), and the EML may be formed of a polymer organic material based on polyphenylene vinylene (PPV) and polyfluorene.

In the above embodiment, the organic emission layer 22 is formed in the opening of the pixel defining layer 36, and a luminescent material is formed separately in each pixel; however, the present invention is not limited thereto. That is, in one embodiment, the organic emission layer 22 may be formed commonly throughout on the entire pixel define layer 36 without regard to locations of pixels. Here, the organic emission layer 22 may be formed by stacking layers including light emitting materials emitting red, green, and blue light, for example, in a vertical direction or combining the layers. Also, if white light is emitted, other colors may be combined. In addition, a color conversion layer or a color filter for converting the white light into a predetermined color light may be further formed.

However, the organic light emitting device 20 easily deteriorates due to moisture or oxygen, and thus, the encapsulation layer 130 is disposed to cover the display unit 120 in which the organic light emitting device 20 is located, as described above.

The encapsulation layer 130 may be formed by alternately stacking one or more organic layers and one or more inorganic layers.

A plurality of inorganic layers and a plurality of organic layers may be stacked.

The organic layer is formed of a polymer, for example, may be a single layer or a stacked layer formed of one selected from polyethylene terephthalate, polyimide, polycarbonate, epoxy, polyethylene, and polyacrylate. For example, the organic layer may be formed of polyacrylate, in more detail, may include a polymerized monomer composition including diacrylate-based monomer and triacrylate-based monomer. The monomer composition may further include monoacrylate-based monomer. Also, the monomer composition may further include a photoinitiator such as TPO; however, the present invention is not limited thereto.

The inorganic layer may be a single layer or stacked layers including metal oxide or metal nitride. In particular, the inorganic layer may include one of SiNx, $Al_2O_3$, $SiO_2$, and $TiO_2$.

The uppermost layer of the encapsulation layer 130, which is exposed to the outside, may be formed of an inorganic layer to prevent moisture from infiltrating into the organic light emitting device 20.

The encapsulation layer 130 may include at least one sandwich structure in which at least one organic layer is interposed between at least two inorganic layers. Also, the encapsulation layer 130 may include at least one sandwich structure in which at least one inorganic layer is interposed between at least two organic layers.

The encapsulation layer 130 may include a first inorganic layer, a first organic layer, and a second inorganic layer in the stated order from the upper portion of the display unit 120. Also, the encapsulation layer may include a first inorganic layer, a first organic layer, a second inorganic layer, a second organic layer, and a third inorganic layer in the stated order from the upper portion of the display unit 120. Otherwise, the encapsulation layer 130 may include a first inorganic layer, a first organic layer, a second inorganic layer, a second organic layer, a third inorganic layer, a third organic layer, and a fourth inorganic layer in the stated order from the upper portion of the display unit 120.

A halogenated metal layer including LiF may be additionally disposed between the display unit 120 and the first inorganic layer. The halogenated metal layer may prevent damage to the display unit 120 when the first inorganic layer is formed by a sputtering method or a plasma deposition method.

The first organic layer has an area that is less than that of the second inorganic layer, and the second organic layer may have an area that is less than that of the third inorganic layer. Also, the first organic layer is completely covered by the second inorganic layer, and the second organic layer may be completely covered by the third inorganic layer.

Figure 2:
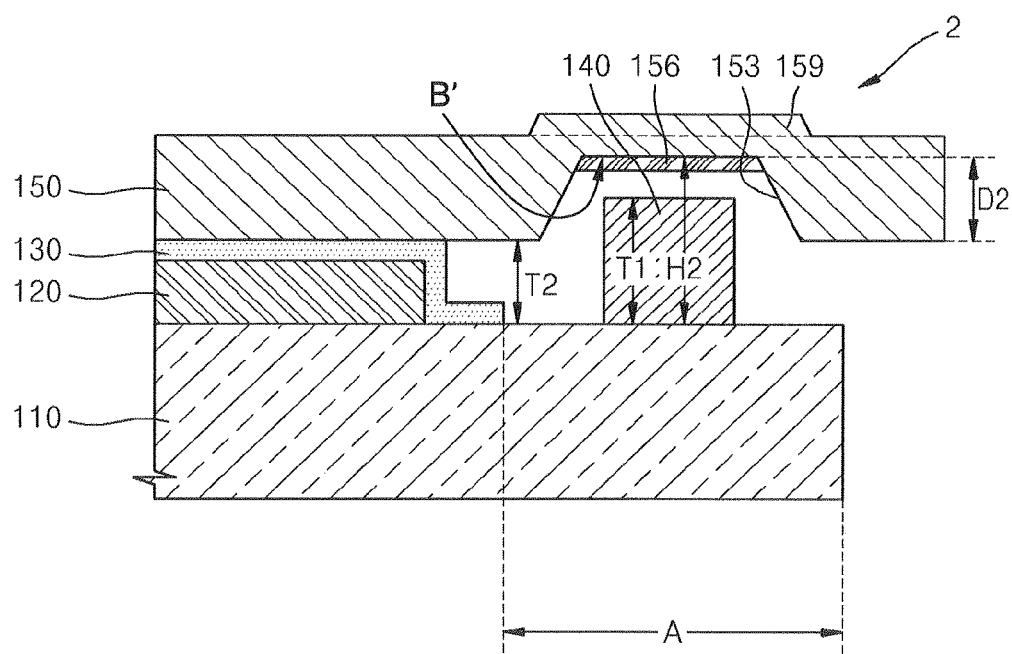
FIG. 2 is a cross-sectional view schematically showing a part of an organic light emitting display apparatus according to another embodiment of the present invention.

FIG. 2 is a cross-sectional view schematically showing a part of an organic light emitting display apparatus 2 according to another embodiment of the present invention.

Hereinafter, differences of the organic light emitting display apparatus 2 of the present embodiment from the organic light-emitting display apparatus 1 will be described below. Here, like reference numerals denote the same elements performing the same function.

In reference to FIG. 2, the organic light emitting display apparatus 2 may include the substrate 110, the display unit 120, the encapsulation layer 130, the integrated circuit device 140, and a transparent protection unit (window) 150.

The display unit 120 may be disposed on the substrate 110, and the encapsulation layer 130 may be formed to cover the display unit 120. Also, the integrated circuit device 140 may be disposed on the substrate 110 at an outer side of the display unit 120. Also, the transparent protection unit 150 may be disposed on the encapsulation layer 130. The transparent protection unit 150 and the integrated circuit device 140 are separated from and spaced apart from each other.

The integrated circuit device 140 may be disposed on the substrate 110 at the outer side of the display unit 120 to control light emission from the display unit 120. That is, the integrated circuit device 140 may be disposed on the substrate 110 as a COG type. In this case, the integrated circuit device 140 may be disposed under the transparent protection unit 150 that is disposed on the display unit 120. Also, the integrated circuit device 140 may be disposed at an edge portion of the substrate 110.

The transparent protection unit 150 may be disposed on the encapsulation layer 130. Also, the transparent protection unit 150 may be separated from the integrated circuit unit 140. The transparent protection unit 150 may be attached to a housing (not shown) by an adhesive member (not shown). Also, the transparent protection unit 150 may extend so as to have a length that is longer than that of the substrate 110. In addition, the integrated circuit device 140 may be disposed under the transparent protection unit 150.

A second recess 153 may be formed in a portion of the transparent protection unit 150, which geometrically corresponds to the integrated circuit device 140. The second recess 153 may be formed when the transparent protection unit 150 is formed, or may be formed by forming a transparent protection unit having flat surfaces and etching a part of the transparent protection unit by using an etchant or a laser ablation method. In addition, a part of the integrated circuit device 140 may be in the second recess 153. Also, a depth D2 of the second recess 153 may be less than the thickness T1 of the integrated circuit device 140.

A buffer unit 156 may be formed in the second recess 153 that is formed in the transparent protection unit 150. In one embodiment, the buffer unit 156 may be formed on the bottom surface B' of the second recess 153 facing towards the substrate 110. The buffer unit 156 may be formed of synthetic resin such as rubber having a cushion. Since the second recess 153 is formed in the transparent protection unit 150, a thickness of the region where the second recess 153 is formed is reduced. Here, by forming the buffer unit 156 in the second recess 153, the region of the transparent protection unit 150, which has the reduced thickness, may be reinforced. Also, the buffer unit 156 may reduce the shock applied to the integrated circuit device 140 if the integrated circuit device 140 and the transparent protection unit 150 contact each other due to external shock.

In addition, a protrusion 159 may be formed on an opposite surface to the region where the second recess 153 is formed in the transparent protection unit 150. The protrusion 159 may be formed of a material that is the same as that forming a substrate of the transparent protection unit 150. The protrusion 159 may be formed when the substrate of the transparent protection unit 150 is formed, or may be formed additionally after forming a substrate of the transparent protection unit, which has flat surfaces. Since the second recess 153 is formed in the transparent protection unit 150, a thickness at the region where the second recess 153 is formed is reduced. Therefore, by forming the protrusion 159 on an opposite surface to the region where the second recess 153 is formed in the transparent protection unit 150, the region of the transparent protection unit 150 having the reduced thickness may be reinforced.

The thickness T1 of the integrated circuit device 140 may be greater than or less than the sum T2 of the thickness of the display unit 120 and the thickness of the encapsulation layer 130.

In a case where the thickness T1 of the integrated circuit device 140 is less than the sum T2 of the thickness of the display unit 120 and the thickness of the encapsulation unit 130, when the integrated circuit device 140 is disposed on the outer side of the display unit 120 and under the transparent protection unit 150 on the substrate 110, the integrated circuit device 140 may be separated from the transparent protection unit 150 even if the second recess 153 is not formed in the transparent protection unit 150.

However, the thickness T1 of the integrated circuit device 140 is generally greater than the sum T2 of the thickness of the display unit 120 and the thickness of the encapsulation unit 130. In this case, if the integrated circuit device 140 is disposed on the substrate 110, the integrated circuit device 140 contacts the transparent protection unit 150 disposed on the encapsulation layer 130. Since the integrated circuit device 140 has a low breaking strength, the integrated circuit device 140 is vulnerable to external shock when contacting the transparent protection unit 150.

Therefore, when the thickness T1 of the integrated circuit device 140 is greater than the sum T2 of the thickness of the display unit 120 and the thickness of the encapsulation unit 130, the second recess 153 may be formed in the transparent protection unit 150 at a portion geometrically corresponding to the integrated circuit device 140. Here, the depth D2 of the second recess 153 may be greater than a value that is obtained by subtracting the sum T2 from the thickness T1 of the integrated circuit device 140. If the integrated circuit device 140 is disposed under the second recess 153, the thickness T1 of the integrated circuit device 140 may be less than a height H2 measured from the upper surface of the substrate 110 to the bottom surface B' of the second recess 153. That is, since the integrated circuit device 140 is disposed under the second recess 153 of the transparent protection unit 150, the integrated circuit device 140 may be separated from and spaced apart from the transparent protection unit 150. Thus, since the integrated circuit device 140 is separated from the transparent protection unit 150, a direct transfer of an external shock to the integrated circuit device 140 may be prevented. As such, damage to the integrated circuit device 140 may be prevented to improve reliability thereof while forming the slim organic light emitting display apparatus 2.

Figure 3:
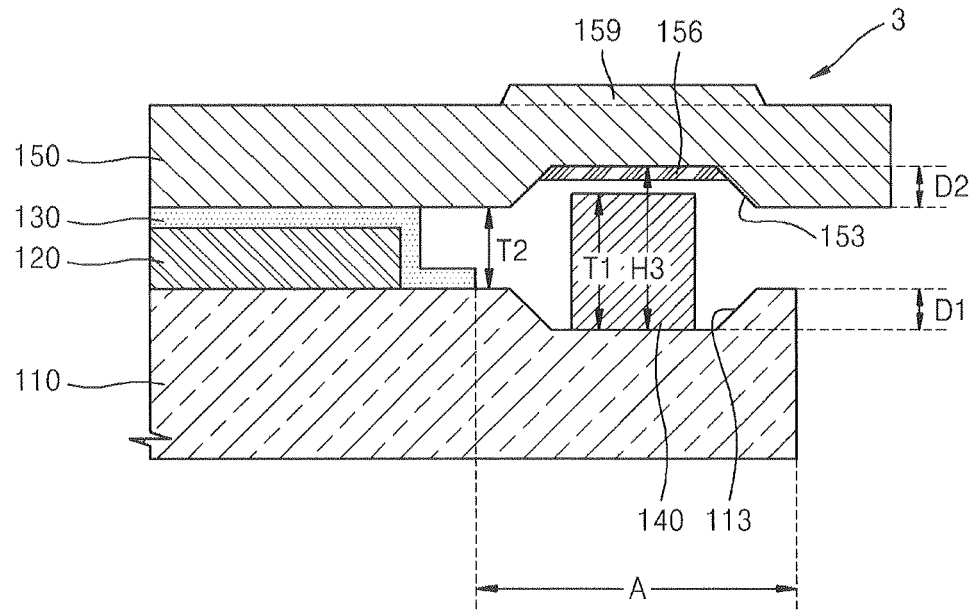
FIG. 3 is a cross-sectional view schematically showing a part of an organic light emitting display apparatus according to another embodiment of the present invention.

FIG. 3 is a cross-sectional view schematically showing an organic light emitting display apparatus 3 according to another embodiment of the present invention.

Hereinafter, differences of the organic light emitting display apparatus 3 of the present embodiment from the organic light-emitting display apparatus 1 will be described below. Here, like reference numerals denote the same elements performing the same function.

In reference to FIG. 3, the organic light emitting display apparatus 3 may include the substrate 110, the display unit 120, the encapsulation layer 130, the integrated circuit device 140, and a transparent protection unit (window) 150.

The display unit 120 may be disposed on the substrate 110, and the encapsulation layer 130 may be formed to cover the display unit 120. Also, the integrated circuit device 140 may be disposed on the substrate 110 at an outer side of the display unit 120. Also, the transparent protection unit 150 may be disposed on the encapsulation layer 130. The transparent protection unit 150 and the integrated circuit device 140 are separated from each other.

A first recess 113 may be formed in the substrate 110 at an outer side of the encapsulation layer 130. The first recess 113 may be formed when forming the substrate 110, or may be formed by removing a part of the substrate 110 by using an etchant or a laser ablation method after forming the substrate 110 having flat surfaces. In addition, the integrated circuit device 140 may be disposed in the first recess 113. A depth D1 of the first recess 113 may be less than a thickness T1 of the integrated circuit device 140.

The integrated circuit device 140 may be disposed on the substrate 110 at the outer side of the display unit 120 to control light emission from the display unit 120. That is, the integrated circuit device 140 may be disposed on the substrate 110 as a COG type. Also, in this case, the integrated circuit device 140 may be disposed under the transparent protection unit 150 disposed on the display unit 120. In addition, the integrated circuit device 140 may be disposed on an edge portion of the substrate 110.

The transparent protection unit 150 may be disposed on the encapsulation layer 130. Also, the transparent protection unit 150 may be separated from and spaced apart from the integrated circuit unit 140. The transparent protection unit 150 may be attached to a housing (not shown) by an adhesive member (not shown). Also, the transparent protection unit 150 may extend so as to have a length that is longer than that of the substrate 110. In addition, the integrated circuit device 140 may be disposed under the transparent protection unit 150.

The second recess 153 may be formed in a portion of the transparent protection unit 150, which geometrically corresponds to the integrated circuit device 140. The second recess 153 may be formed when the transparent protection unit 150 is formed, or may be formed by forming a transparent protection unit having flat surfaces and etching a part of the transparent protection unit by using an etchant or a laser ablation method. In addition, a part of the integrated circuit device 140 may be in the second recess 153. Also, a depth D2 of the second recess 153 may be less than the thickness T1 of the integrated circuit device 140.

The buffer unit 156 may be formed in the second recess 153 that is formed in the transparent protection unit 150. The buffer unit 156 may be formed of synthetic resin such as rubber having a cushion. Since the second recess 153 is formed in the transparent protection unit 150, a thickness of the region where the second recess 153 is formed is reduced. Here, by forming the buffer unit 156 in the second recess 153, the region of the transparent protection unit 150, which has the reduced thickness, may be reinforced. Also, the buffer unit 156 may reduce the shock applied to the integrated circuit device 140 if the integrated circuit device 140 and the transparent protection unit 150 contact each other due to external shock.

In addition, the protrusion 159 may be formed on an opposite surface to the region where the second recess 153 is formed in the transparent protection unit 150. The protrusion 159 may be formed of a material that is the same as that forming a substrate of the transparent protection unit 150. The protrusion 159 may be formed when the substrate of the transparent protection unit 150 is formed, or may be formed additionally after forming a substrate of the transparent protection unit, which has flat surfaces. Since the second recess 153 is formed in the transparent protection unit 150, a thickness at the region where the second recess 153 is formed is reduced. Therefore, by forming the protrusion 159 on an opposite surface to the region where the second recess 153 is formed in the transparent protection unit 150, the region of the transparent protection unit 150 having the reduced thickness may be reinforced.

The thickness T1 of the integrated circuit device 140 may be greater than or less than the sum T2 of the thickness of the display unit 120 and the thickness of the encapsulation layer 130.

In a case where the thickness T1 of the integrated circuit device 140 is less than the sum T2 of the thickness of the display unit 120 and the thickness of the encapsulation unit 130, when the integrated circuit device 140 is disposed on the outer side of the display unit 120 and under the transparent protection unit 150 on the substrate 110, the integrated circuit device 140 may be separated from the transparent protection unit 150 even if the first and second recesses 113 and 153 are not formed in the transparent protection unit 150.

However, the thickness T1 of the integrated circuit device 140 is generally greater than the sum T2 of the thickness of the display unit 120 and the thickness of the encapsulation unit 130. In this case, if the integrated circuit device 140 is disposed on the substrate 110, the integrated circuit device 140 contacts the transparent protection unit 150 disposed on the encapsulation layer 130. Since the integrated circuit device 140 has a low breaking strength, the integrated circuit device 140 is vulnerable to external shock when contacting the transparent protection unit 150.

Therefore, when the thickness T1 of the integrated circuit device 140 is greater than the sum T2 of the thickness of the display unit 120 and the thickness of the encapsulation unit 130, the first recess 113 may be formed in the substrate 110 at the outer side of the encapsulation layer 130 and the second recess 153 may be formed in the transparent protection unit 150 at the portion corresponding to the integrated circuit device 140. Here, a sum of the depth D1 of the first recess 113 and the depth D2 of the second recess 153 may be greater than a value obtained by subtracting the sum T2 of the thicknesses of the display unit 120 and the encapsulation layer 130 from the thickness T1 of the integrated circuit device 140. When the integrated circuit device 140 is located in the first recess 113 under the second recess 153 as described above, the thickness T1 of the integrated circuit device 140 may be less than a height H3 from the first recess 113 to the second recess 153. That is, since the integrated circuit 140 is disposed in the first recess 113 and under the second recess 153 of the transparent protection unit 150, the integrated circuit device 140 may be separated from the transparent protection unit 150. That is, since the integrated circuit device 140 is separated from and spaced apart from the transparent protection unit 150, a direct transfer of an external shock to the integrated circuit device 140 may be prevented. Thus, damage to the integrated circuit device 140 may be prevented to improve the reliability while forming the slim organic light emitting display apparatus 3.

According to the aspect of the present invention, a slimmer type organic light emitting display apparatus may be manufactured.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light emitting display apparatus comprising:
   a plastic substrate;
   a display unit disposed on the plastic substrate;
   an encapsulation layer covering the display unit; and
   an integrated circuit device disposed on the plastic substrate and separated from the encapsulation layer,
   wherein the encapsulation layer is formed by alternately stacking one or more organic layers and one or more inorganic layers.

2. The organic light emitting display apparatus of claim 1, the integrated circuit device is disposed on the plastic substrate as a chip on glass (COG) type.

3. The organic light emitting display apparatus of claim 1, further comprising a transparent protection unit disposed on the encapsulation layer.

4. The organic light emitting display apparatus of claim 3, wherein the transparent protection unit is separated from the integrated circuit device.

5. The organic light emitting display apparatus of claim 4, wherein the plastic substrate extends longer than the encapsulation layer, and the transparent protection unit extends longer than the plastic substrate,
   wherein the integrated circuit device is disposed between the plastic substrate and the transparent protection unit.

6. The organic light emitting display apparatus of claim 5, wherein at least one of the plastic substrate and the transparent protection unit comprises a recess, and the integrated circuit device is disposed in the recess.

7. The organic light emitting display apparatus of claim 6, wherein the recess has a depth that is less than a thickness of the integrated circuit device.

8. The organic light emitting display apparatus of claim 6, wherein a thickness of the integrated circuit device is greater than a sum of a thickness of the display unit and a thickness of the encapsulation layer.

9. The organic light emitting display apparatus of claim 6, wherein the recess is formed in the substrate on an outer portion of the encapsulation layer, a depth of the recess is greater than a value that is obtained by subtracting a sum of a thickness of the display unit and a thickness of the encapsulation layer from a thickness of the integrated circuit device.

10. The organic light emitting display apparatus of claim 9, wherein the thickness of the integrated circuit device is less than a height from the recess to the transparent protection unit.

11. The organic light emitting display apparatus of claim 6, wherein the transparent protection unit comprises the recess in a portion geometrically corresponding to the integrated circuit device,
    wherein a depth of the recess is greater than a value that is obtained by subtracting a sum of a thickness of the display unit and a thickness of the encapsulation layer from a thickness of the integrated circuit device.

12. The organic light emitting display apparatus of claim 11, wherein the thickness of the integrated circuit device is less than a height from the substrate to the recess.

13. The organic light emitting display apparatus of claim 11, wherein a buffer unit is formed in the recess.

14. The organic light emitting display apparatus of claim 11, wherein the transparent protection unit comprises a protrusion on an opposite surface to the region where the recess is formed.

15. The organic light emitting display apparatus of claim 6, wherein the recess comprises a first recess formed in the substrate on an outer portion of the encapsulation layer and a second recess formed in the transparent protection unit on a portion geometrically corresponding to the integrated circuit device,
    wherein a sum of a depth of the first recess and a depth of the second recess is greater than a value that is obtained by subtracting a sum of a thickness of the display unit and a thickness of the encapsulation layer from a thickness of the integrated circuit device.

16. The organic light emitting display apparatus of claim 15, wherein the thickness of the integrated circuit device is less than a height from the first recess to the second recess.

17. The organic light emitting display apparatus of claim 15, wherein a buffer unit is formed in the second recess.

18. The organic light emitting display apparatus of claim 15, wherein the transparent protection unit comprises a protrusion on an opposite surface to the region where the second recess is formed.

* * * * *